(12) United States Patent
Jamneala et al.

(10) Patent No.: US 8,981,876 B2
(45) Date of Patent: Mar. 17, 2015

(54) PIEZOELECTRIC RESONATOR STRUCTURES AND ELECTRICAL FILTERS HAVING FRAME ELEMENTS

(75) Inventors: Tiberiu Jamneala, San Francisco, CA (US); Richard C. Ruby, Menlo Park, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 140 days.

(21) Appl. No.: 11/713,726

(22) Filed: Mar. 5, 2007

(65) Prior Publication Data

US 2007/0205850 A1 Sep. 6, 2007

Related U.S. Application Data

(63) Continuation-in-part of application No. 10/990,201, filed on Nov. 15, 2004, now Pat. No. 7,280,007.

(51) Int. Cl.
| | | |
|---|---|---|
| H03H 9/15 | (2006.01) | |
| H03H 9/17 | (2006.01) | |
| H03H 9/02 | (2006.01) | |
| H03H 9/13 | (2006.01) | |
| H03H 9/09 | (2006.01) | |

(52) U.S. Cl.
CPC ........... *H03H 9/173* (2013.01); *H03H 9/02118* (2013.01); *H03H 9/13* (2013.01); *H03H 9/177* (2013.01)
USPC .......................................... 333/187; 333/188

(58) Field of Classification Search
CPC ........ H03H 9/09; H03H 9/02007; H03H 9/15
USPC ..................... 333/187, 188, 189; 310/312
See application file for complete search history.

(56) References Cited

U.S. PATENT DOCUMENTS

| | | |
|---|---|---|
| 3,174,122 A | 3/1965 | Fowler et al. |
| 3,189,851 A | 6/1965 | Fowler |
| 3,321,648 A | 5/1967 | Kolm |
| 3,422,371 A | 1/1969 | Poirier et al. |
| 3,568,108 A | 3/1971 | Poirier et al. |
| 3,582,839 A | 6/1971 | Pim et al. |
| 3,590,287 A | 6/1971 | Berlincourt et al. |
| 3,610,969 A | 10/1971 | Clawson et al. |
| 3,826,931 A | 7/1974 | Hammond |
| 3,845,402 A | 10/1974 | Nupp |
| 4,084,217 A | 4/1978 | Brandli et al. |
| 4,172,277 A | 10/1979 | Pinson |
| 4,272,742 A | 6/1981 | Lewis |
| 4,281,299 A | 7/1981 | Newbold |
| 4,320,365 A | 3/1982 | Black et al. |

(Continued)

FOREIGN PATENT DOCUMENTS

| | | |
|---|---|---|
| DE | 10160617 | 6/2003 |
| DE | 10239317 | 3/2004 |

(Continued)

OTHER PUBLICATIONS

Merriam-Webster, Collegiate Dictionary, 2000, tenth edition, 2 pages.*

(Continued)

*Primary Examiner* — Dean Takaoka

(57) ABSTRACT

Film bulk acoustic resonators (FBARs) having frame elements and filters including the resonators are described.

22 Claims, 4 Drawing Sheets

(56) References Cited

U.S. PATENT DOCUMENTS

| | | |
|---|---|---|
| 4,344,004 A | 8/1982 | Okubo |
| 4,355,408 A | 10/1982 | Scarrott |
| 4,456,850 A | 6/1984 | Inoue et al. |
| 4,529,904 A | 7/1985 | Hattersley |
| 4,608,541 A | 8/1986 | Moriwaki et al. |
| 4,625,138 A | 11/1986 | Ballato |
| 4,633,285 A | 12/1986 | Hunsinger et al. |
| 4,640,756 A | 2/1987 | Wang et al. |
| 4,719,383 A | 1/1988 | Wang et al. |
| 4,769,272 A | 9/1988 | Byrne et al. |
| 4,798,990 A | 1/1989 | Henoch |
| 4,819,215 A | 4/1989 | Yokoyama et al. |
| 4,836,882 A | 6/1989 | Ballato |
| 4,841,429 A | 6/1989 | McClanahan et al. |
| 4,906,840 A | 3/1990 | Zdeblick et al. |
| 4,933,743 A | 6/1990 | Thomas et al. |
| 5,006,478 A | 4/1991 | Kobayashi et al. |
| 5,048,036 A | 9/1991 | Scifres et al. |
| 5,048,038 A | 9/1991 | Brennan et al. |
| 5,066,925 A | 11/1991 | Freitag |
| 5,075,641 A | 12/1991 | Weber et al. |
| 5,087,959 A | 2/1992 | Omori et al. |
| 5,111,157 A | 5/1992 | Komiak |
| 5,118,982 A | 6/1992 | Inoue et al. |
| 5,129,132 A | 7/1992 | Zdeblick et al. |
| 5,162,691 A | 11/1992 | Mariani et al. |
| 5,166,646 A | 11/1992 | Avanic et al. |
| 5,185,589 A | 2/1993 | Krishnaswamy et al. |
| 5,214,392 A | 5/1993 | Kobayashi et al. |
| 5,233,259 A | 8/1993 | Krishnaswamy et al. |
| 5,241,209 A | 8/1993 | Sasaki |
| 5,241,456 A | 8/1993 | Marcinkiewicz et al. |
| 5,262,347 A | 11/1993 | Sands |
| 5,270,492 A | 12/1993 | Fukui |
| 5,294,898 A | 3/1994 | Dworsky et al. |
| 5,361,077 A | 11/1994 | Weber |
| 5,382,930 A | 1/1995 | Stokes et al. |
| 5,384,808 A | 1/1995 | Van Brunt et al. |
| 5,448,014 A | 9/1995 | Kong et al. |
| 5,465,725 A | 11/1995 | Seyed-Bolorforosh |
| 5,475,351 A | 12/1995 | Uematsu et al. |
| 5,548,189 A | 8/1996 | Williams |
| 5,567,334 A | 10/1996 | Baker et al. |
| 5,587,620 A | 12/1996 | Ruby et al. |
| 5,589,858 A | 12/1996 | Kadowaki et al. |
| 5,594,705 A | 1/1997 | Connor et al. |
| 5,603,324 A | 2/1997 | Oppelt et al. |
| 5,633,574 A | 5/1997 | Sage |
| 5,671,242 A | 9/1997 | Takiguchi et al. |
| 5,692,279 A | 12/1997 | Mang et al. |
| 5,698,928 A | 12/1997 | Mang et al. |
| 5,704,037 A | 12/1997 | Chen |
| 5,705,877 A | 1/1998 | Shimada |
| 5,714,917 A | 2/1998 | Ella |
| 5,729,008 A | 3/1998 | Blalock et al. |
| 5,789,845 A | 8/1998 | Wadaka et al. |
| 5,817,446 A | 10/1998 | Lammert |
| 5,825,092 A | 10/1998 | Delgado et al. |
| 5,835,142 A | 11/1998 | Nakamura et al. |
| 5,853,601 A | 12/1998 | Krishaswamy et al. |
| 5,864,261 A | 1/1999 | Weber |
| 5,866,969 A | 2/1999 | Shimada et al. |
| 5,872,493 A | 2/1999 | Ella |
| 5,873,153 A | 2/1999 | Ruby et al. |
| 5,873,154 A | 2/1999 | Ylilammi et al. |
| 5,894,184 A | 4/1999 | Furuhashi et al. |
| 5,894,647 A | 4/1999 | Lakin |
| 5,910,756 A | 6/1999 | Ella |
| 5,932,953 A | 8/1999 | Drees et al. |
| 5,936,150 A | 8/1999 | Kobrin et al. |
| 5,953,479 A | 9/1999 | Zhou et al. |
| 5,955,926 A | 9/1999 | Uda et al. |
| 5,962,787 A | 10/1999 | Okada et al. |
| 5,969,463 A | 10/1999 | Tomita |
| 5,982,297 A | 11/1999 | Welle |
| 6,001,664 A | 12/1999 | Swirhun et al. |
| 6,016,052 A | 1/2000 | Vaughn |
| 6,040,962 A | 3/2000 | Kanazawa et al. |
| 6,051,907 A | 4/2000 | Ylilammi |
| 6,060,818 A | 5/2000 | Ruby et al. |
| 6,087,198 A | 7/2000 | Panasik |
| 6,090,687 A | 7/2000 | Merchant et al. |
| 6,107,721 A | 8/2000 | Lakin |
| 6,111,341 A | 8/2000 | Hirama |
| 6,111,480 A | 8/2000 | Iyama et al. |
| 6,114,795 A | 9/2000 | Tajima et al. |
| 6,118,181 A | 9/2000 | Merchant et al. |
| 6,124,678 A | 9/2000 | Bishop et al. |
| 6,124,756 A | 9/2000 | Yaklin et al. |
| 6,131,256 A | 10/2000 | Dydyk |
| 6,150,703 A | 11/2000 | Cushman et al. |
| 6,187,513 B1 | 2/2001 | Katakura |
| 6,198,208 B1 | 3/2001 | Yano et al. |
| 6,215,375 B1 | 4/2001 | Larson, III et al. |
| 6,219,032 B1 | 4/2001 | Rosenberg et al. |
| 6,219,263 B1 | 4/2001 | Wuidart |
| 6,228,675 B1 | 5/2001 | Ruby et al. |
| 6,229,247 B1 | 5/2001 | Bishop |
| 6,252,229 B1 | 6/2001 | Hays et al. |
| 6,262,600 B1 | 7/2001 | Haigh et al. |
| 6,262,637 B1 | 7/2001 | Bradley et al. |
| 6,263,735 B1 | 7/2001 | Nakatani et al. |
| 6,265,246 B1 | 7/2001 | Ruby et al. |
| 6,278,342 B1 | 8/2001 | Ella |
| 6,284,121 B1 | 9/2001 | Reid |
| 6,292,336 B1 | 9/2001 | Horng et al. |
| 6,306,755 B1 | 10/2001 | Zheng |
| 6,307,447 B1 | 10/2001 | Barber et al. |
| 6,307,761 B1 | 10/2001 | Nakagawa |
| 6,335,548 B1 | 1/2002 | Roberts et al. |
| 6,355,498 B1 | 3/2002 | Chan et al. |
| 6,366,006 B1 | 4/2002 | Boyd |
| 6,376,280 B1 | 4/2002 | Ruby et al. |
| 6,377,137 B1 | 4/2002 | Ruby |
| 6,384,697 B1 | 5/2002 | Ruby |
| 6,396,200 B2 | 5/2002 | Misu et al. |
| 6,407,649 B1 | 6/2002 | Tikka et al. |
| 6,414,569 B1 | 7/2002 | Nakafuku |
| 6,420,820 B1 | 7/2002 | Larson, III |
| 6,424,237 B1 | 7/2002 | Ruby et al. |
| 6,429,511 B2 | 8/2002 | Ruby et al. |
| 6,434,030 B1 | 8/2002 | Rehm et al. |
| 6,437,482 B1 | 8/2002 | Shibata |
| 6,441,539 B1 | 8/2002 | Kitamura et al. |
| 6,441,702 B1 | 8/2002 | Ella et al. |
| 6,462,631 B2 | 10/2002 | Bradley et al. |
| 6,466,105 B1 | 10/2002 | Lobl et al. |
| 6,466,418 B1 | 10/2002 | Horng et al. |
| 6,469,597 B2 | 10/2002 | Ruby et al. |
| 6,469,909 B2 | 10/2002 | Simmons |
| 6,472,954 B1 | 10/2002 | Ruby et al. |
| 6,476,536 B1 | 11/2002 | Pensala |
| 6,479,320 B1 | 11/2002 | Gooch |
| 6,483,229 B2 | 11/2002 | Larson, III et al. |
| 6,486,751 B1 | 11/2002 | Barber et al. |
| 6,489,688 B1 | 12/2002 | Baumann et al. |
| 6,492,883 B2 | 12/2002 | Liang et al. |
| 6,496,085 B2 | 12/2002 | Ella |
| 6,498,604 B1 | 12/2002 | Jensen |
| 6,507,983 B1 | 1/2003 | Ruby et al. |
| 6,515,558 B1 | 2/2003 | Ylilammi |
| 6,518,860 B2 | 2/2003 | Ella et al. |
| 6,525,996 B1 | 2/2003 | Miyazawa |
| 6,528,344 B2 | 3/2003 | Kang |
| 6,530,515 B1 | 3/2003 | Glenn et al. |
| 6,534,900 B2 | 3/2003 | Aigner et al. |
| 6,542,055 B1 | 4/2003 | Frank et al. |
| 6,548,942 B1 | 4/2003 | Panaski |
| 6,548,943 B2 | 4/2003 | Kaitila et al. |
| 6,549,394 B1 | 4/2003 | Williams |
| 6,550,664 B2 | 4/2003 | Bradley et al. |
| 6,559,487 B1 | 5/2003 | Kang et al. |
| 6,559,530 B2 | 5/2003 | Hinzel et al. |
| 6,564,448 B1 | 5/2003 | Oura et al. |

(56) References Cited

U.S. PATENT DOCUMENTS

| | | |
|---|---|---|
| 6,566,956 B2 | 5/2003 | Ohnishi et al. |
| 6,566,979 B2 | 5/2003 | Larson, III et al. |
| 6,580,159 B1 | 6/2003 | Fusaro et al. |
| 6,583,374 B2 | 6/2003 | Knieser et al. |
| 6,583,688 B2 | 6/2003 | Klee et al. |
| 6,593,870 B2 | 7/2003 | Dummermuth et al. |
| 6,594,165 B2 | 7/2003 | Duerbaum et al. |
| 6,600,390 B2 | 7/2003 | Frank |
| 6,601,276 B2 | 8/2003 | Barber |
| 6,603,182 B1 | 8/2003 | Low et al. |
| 6,607,934 B2 | 8/2003 | Chang et al. |
| 6,617,249 B2 | 9/2003 | Ruby et al. |
| 6,617,750 B2 | 9/2003 | Dummermuth et al. |
| 6,617,751 B2 | 9/2003 | Sunwoo et al. |
| 6,621,137 B1 | 9/2003 | Ma et al. |
| 6,630,753 B2 | 10/2003 | Malik et al. |
| 6,635,509 B1 | 10/2003 | Ouellet |
| 6,639,872 B1 | 10/2003 | Rein |
| 6,651,488 B2 | 11/2003 | Larson, III et al. |
| 6,657,363 B1 | 12/2003 | Aigner |
| 6,668,618 B2 | 12/2003 | Larson, III et al. |
| 6,670,866 B2 | 12/2003 | Ella et al. |
| 6,677,929 B2 | 1/2004 | Gordon et al. |
| 6,693,500 B2 | 2/2004 | Yang et al. |
| 6,710,508 B2 | 3/2004 | Ruby et al. |
| 6,710,681 B2 | 3/2004 | Figueredo et al. |
| 6,713,314 B2 | 3/2004 | Wong et al. |
| 6,714,102 B2 | 3/2004 | Ruby et al. |
| 6,720,844 B1 | 4/2004 | Lakin |
| 6,720,846 B2 | 4/2004 | Iwashita et al. |
| 6,724,266 B2 | 4/2004 | Plazza et al. |
| 6,738,267 B1 | 5/2004 | Navas Sabater et al. |
| 6,750,593 B2 | 6/2004 | Iwata |
| 6,774,746 B2 | 8/2004 | Whatmore et al. |
| 6,777,263 B1 | 8/2004 | Gan et al. |
| 6,787,048 B2 | 9/2004 | Bradley et al. |
| 6,788,170 B1 | 9/2004 | Kaitila et al. |
| 6,803,835 B2 | 10/2004 | Frank |
| 6,812,619 B1 | 11/2004 | Kaitila et al. |
| 6,820,469 B1 | 11/2004 | Adkins et al. |
| 6,828,713 B2 | 12/2004 | Bradley et al. |
| 6,842,088 B2 | 1/2005 | Yamada et al. |
| 6,842,089 B2 | 1/2005 | Lee |
| 6,849,475 B2 | 2/2005 | Kim |
| 6,853,534 B2 | 2/2005 | Williams |
| 6,861,920 B2 | 3/2005 | Ishikawa et al. |
| 6,872,931 B2 | 3/2005 | Liess et al. |
| 6,873,065 B2 | 3/2005 | Haigh et al. |
| 6,873,529 B2 | 3/2005 | Ikuta |
| 6,874,211 B2 | 4/2005 | Bradley et al. |
| 6,874,212 B2 | 4/2005 | Larson, III |
| 6,888,424 B2 | 5/2005 | Takeuchi et al. |
| 6,900,705 B2 | 5/2005 | Nakamura et al. |
| 6,903,452 B2 | 6/2005 | Ma et al. |
| 6,906,451 B2 | 6/2005 | Yamada et al. |
| 6,911,708 B2 | 6/2005 | Park |
| 6,917,261 B2 | 7/2005 | Unterberger |
| 6,924,583 B2 | 8/2005 | Lin et al. |
| 6,924,717 B2 | 8/2005 | Ginsburg et al. |
| 6,927,651 B2 | 8/2005 | Larson, III et al. |
| 6,936,837 B2 | 8/2005 | Yamada et al. |
| 6,936,928 B2 | 8/2005 | Hedler et al. |
| 6,936,954 B2 | 8/2005 | Peczalski |
| 6,941,036 B2 | 9/2005 | Lucero |
| 6,943,647 B2 | 9/2005 | Aigner |
| 6,943,648 B2 | 9/2005 | Maiz et al. |
| 6,946,928 B2 | 9/2005 | Larson et al. |
| 6,954,121 B2 | 10/2005 | Bradley et al. |
| 6,963,257 B2 | 11/2005 | Ella |
| 6,970,365 B2 | 11/2005 | Turchi |
| 6,975,183 B2 | 12/2005 | Aigner et al. |
| 6,977,563 B2 | 12/2005 | Komuro et al. |
| 6,985,051 B2 | 1/2006 | Nguyen et al. |
| 6,985,052 B2 | 1/2006 | Tikka |
| 6,987,433 B2 | 1/2006 | Larson et al. |
| 6,989,723 B2 | 1/2006 | Komuro et al. |
| 6,998,940 B2 | 2/2006 | Metzger |
| 7,002,437 B2 | 2/2006 | Takeuchi et al. |
| 7,019,604 B2 | 3/2006 | Gotoh et al. |
| 7,019,605 B2 | 3/2006 | Larson, III et al. |
| 7,026,876 B1 | 4/2006 | Esfandiari et al. |
| 7,053,456 B2 | 5/2006 | Matsuo |
| 7,057,476 B2 | 6/2006 | Hwu |
| 7,057,478 B2 | 6/2006 | Korden et al. |
| 7,064,606 B2 | 6/2006 | Louis |
| 7,084,553 B2 | 8/2006 | Ludwiczak |
| 7,091,649 B2 | 8/2006 | Larson, III et al. |
| 7,098,758 B2 | 8/2006 | Wang et al. |
| 7,102,460 B2 | 9/2006 | Schmidhammer et al. |
| 7,109,826 B2 | 9/2006 | Ginsburg et al. |
| 7,128,941 B2 | 10/2006 | Lee |
| 7,129,806 B2 | 10/2006 | Sato |
| 7,138,889 B2 | 11/2006 | Lakin |
| 7,161,448 B2 * | 1/2007 | Feng et al. .................. 333/187 |
| 7,170,215 B2 | 1/2007 | Namba et al. |
| 7,173,504 B2 | 2/2007 | Larson |
| 7,187,254 B2 | 3/2007 | Su et al. |
| 7,199,683 B2 | 4/2007 | Thalhammer |
| 7,209,374 B2 | 4/2007 | Noro |
| 7,212,083 B2 | 5/2007 | Inoue et al. |
| 7,212,085 B2 | 5/2007 | Wu |
| 7,230,509 B2 | 6/2007 | Stoemmer |
| 7,230,511 B2 | 6/2007 | Onishi et al. |
| 7,233,218 B2 | 6/2007 | Park et al. |
| 7,242,270 B2 | 7/2007 | Larson, III et al. |
| 7,259,498 B2 | 8/2007 | Nakatsuka et al. |
| 7,268,647 B2 | 9/2007 | Sano et al. |
| 7,275,292 B2 | 10/2007 | Ruby et al. |
| 7,276,994 B2 | 10/2007 | Takeuchi et al. |
| 7,280,007 B2 | 10/2007 | Feng et al. |
| 7,281,304 B2 | 10/2007 | Kim et al. |
| 7,294,919 B2 | 11/2007 | Bai |
| 7,301,258 B2 | 11/2007 | Tanaka |
| 7,310,861 B2 | 12/2007 | Aigner et al. |
| 7,313,255 B2 | 12/2007 | Machida et al. |
| 7,332,985 B2 | 2/2008 | Larson, III et al. |
| 7,345,410 B2 | 3/2008 | Grannen et al. |
| 7,358,831 B2 | 4/2008 | Larson, III et al. |
| 7,367,095 B2 | 5/2008 | Larson, III et al. |
| 7,368,857 B2 | 5/2008 | Tanaka |
| 7,369,013 B2 | 5/2008 | Fazzio et al. |
| 7,377,168 B2 | 5/2008 | Liu |
| 7,385,467 B2 | 6/2008 | Stoemmer et al. |
| 7,388,318 B2 | 6/2008 | Yamada et al. |
| 7,388,454 B2 | 6/2008 | Ruby et al. |
| 7,388,455 B2 | 6/2008 | Larson, III |
| 7,391,286 B2 | 6/2008 | Jamneala et al. |
| 7,400,217 B2 | 7/2008 | Larson, III et al. |
| 7,408,428 B2 | 8/2008 | Larson, III |
| 7,414,349 B2 | 8/2008 | Sasaki |
| 7,414,495 B2 | 8/2008 | Iwasaki et al. |
| 7,420,320 B2 | 9/2008 | Sano et al. |
| 7,423,503 B2 | 9/2008 | Larson, III et al. |
| 7,425,787 B2 | 9/2008 | Larson, III |
| 7,439,824 B2 | 10/2008 | Aigner |
| 7,463,118 B2 | 12/2008 | Jacobsen |
| 7,466,213 B2 | 12/2008 | Lobl et al. |
| 7,482,737 B2 | 1/2009 | Yamada et al. |
| 7,508,286 B2 | 3/2009 | Ruby et al. |
| 7,515,018 B2 | 4/2009 | Handtmann et al. |
| 7,535,324 B2 | 5/2009 | Fattinger et al. |
| 7,545,532 B2 | 6/2009 | Muramoto |
| 7,561,009 B2 | 7/2009 | Larson, III et al. |
| 7,576,471 B1 | 8/2009 | Solal |
| 7,602,101 B2 | 10/2009 | Hara et al. |
| 7,619,493 B2 | 11/2009 | Uno et al. |
| 7,629,865 B2 | 12/2009 | Ruby |
| 7,642,693 B2 | 1/2010 | Akiyama et al. |
| 7,655,963 B2 | 2/2010 | Sadaka et al. |
| 7,684,109 B2 | 3/2010 | Godshalk et al. |
| 7,758,979 B2 | 7/2010 | Akiyama et al. |
| 7,768,364 B2 | 8/2010 | Hart et al. |
| 7,791,434 B2 | 9/2010 | Fazzio et al. |
| 7,795,781 B2 | 9/2010 | Barber et al. |

(56) References Cited

U.S. PATENT DOCUMENTS

| | | |
|---|---|---|
| 7,889,024 B2 | 2/2011 | Bradley et al. |
| 8,507,919 B2 | 8/2013 | Ishikura |
| 2001/0026951 A1 | 10/2001 | Vergani et al. |
| 2002/0000646 A1 | 1/2002 | Gooch et al. |
| 2002/0030424 A1 | 3/2002 | Iwata |
| 2002/0063497 A1 | 5/2002 | Panasik |
| 2002/0070463 A1 | 6/2002 | Chang et al. |
| 2002/0121944 A1 | 9/2002 | Larson, III et al. |
| 2002/0121945 A1 | 9/2002 | Ruby et al. |
| 2002/0126517 A1 | 9/2002 | Matsukawa et al. |
| 2002/0140520 A1 | 10/2002 | Hikita et al. |
| 2002/0152803 A1 | 10/2002 | Larson, III et al. |
| 2002/0190814 A1 | 12/2002 | Yamada et al. |
| 2003/0001251 A1 | 1/2003 | Cheever et al. |
| 2003/0006502 A1 | 1/2003 | Karpman |
| 2003/0011285 A1 | 1/2003 | Ossmann |
| 2003/0011446 A1 | 1/2003 | Bradley |
| 2003/0051550 A1 | 3/2003 | Nguyen et al. |
| 2003/0087469 A1 | 5/2003 | Ma |
| 2003/0102776 A1 | 6/2003 | Takeda et al. |
| 2003/0111439 A1 | 6/2003 | Fetter et al. |
| 2003/0128081 A1 | 7/2003 | Ella et al. |
| 2003/0132493 A1 | 7/2003 | Kang et al. |
| 2003/0132809 A1 | 7/2003 | Senthilkumar et al. |
| 2003/0141946 A1 | 7/2003 | Ruby et al. |
| 2003/0155574 A1 | 8/2003 | Doolittle |
| 2003/0179053 A1 | 9/2003 | Aigner et al. |
| 2003/0205948 A1 | 11/2003 | Lin et al. |
| 2004/0016995 A1 | 1/2004 | Kuo et al. |
| 2004/0017130 A1 | 1/2004 | Wang et al. |
| 2004/0056735 A1 | 3/2004 | Nomura et al. |
| 2004/0092234 A1 | 5/2004 | Pohjonen et al. |
| 2004/0099898 A1 | 5/2004 | Grivna et al. |
| 2004/0124952 A1 | 7/2004 | Tikka |
| 2004/0129079 A1 | 7/2004 | Kato et al. |
| 2004/0150293 A1 | 8/2004 | Unterberger |
| 2004/0150296 A1 | 8/2004 | Park et al. |
| 2004/0166603 A1 | 8/2004 | Carley |
| 2004/0195937 A1 | 10/2004 | Matsubara et al. |
| 2004/0212458 A1 | 10/2004 | Lee |
| 2004/0246075 A1 | 12/2004 | Bradley et al. |
| 2004/0257171 A1 | 12/2004 | Park et al. |
| 2004/0257172 A1 | 12/2004 | Schmidhammer et al. |
| 2004/0263287 A1 | 12/2004 | Ginsburg et al. |
| 2005/0012570 A1 | 1/2005 | Korden et al. |
| 2005/0012716 A1 | 1/2005 | Mikulin et al. |
| 2005/0023931 A1 | 2/2005 | Bouche et al. |
| 2005/0030126 A1 | 2/2005 | Inoue et al. |
| 2005/0036604 A1 | 2/2005 | Scott et al. |
| 2005/0057117 A1 | 3/2005 | Nakatsuka et al. |
| 2005/0057324 A1 | 3/2005 | Onishi et al. |
| 2005/0068124 A1 | 3/2005 | Stoemmer |
| 2005/0082626 A1 | 4/2005 | Leedy |
| 2005/0093396 A1 | 5/2005 | Larson, III et al. |
| 2005/0093653 A1 | 5/2005 | Larson, III |
| 2005/0093654 A1 | 5/2005 | Larson, III et al. |
| 2005/0093655 A1 | 5/2005 | Larson, III et al. |
| 2005/0093657 A1 | 5/2005 | Larson, III et al. |
| 2005/0093658 A1 | 5/2005 | Larson, III et al. |
| 2005/0093659 A1 | 5/2005 | Larson, III et al. |
| 2005/0104690 A1 | 5/2005 | Larson, III et al. |
| 2005/0110598 A1 | 5/2005 | Larson, III |
| 2005/0128030 A1 | 6/2005 | Larson, III et al. |
| 2005/0140466 A1 | 6/2005 | Larson, III et al. |
| 2005/0167795 A1 | 8/2005 | Higashi |
| 2005/0193507 A1 | 9/2005 | Ludwiczak |
| 2005/0206271 A1 | 9/2005 | Higuchi |
| 2005/0206479 A1 | 9/2005 | Nguyen et al. |
| 2005/0206483 A1 | 9/2005 | Pashby et al. |
| 2005/0218488 A1 | 10/2005 | Matsuo |
| 2005/0248232 A1 | 11/2005 | Itaya et al. |
| 2005/0269904 A1 | 12/2005 | Oka |
| 2005/0275486 A1 | 12/2005 | Feng |
| 2006/0017352 A1 | 1/2006 | Tanielian |
| 2006/0071736 A1 | 4/2006 | Ruby et al. |
| 2006/0081048 A1 | 4/2006 | Mikado et al. |
| 2006/0087199 A1 | 4/2006 | Larson, III et al. |
| 2006/0103492 A1 | 5/2006 | Feng et al. |
| 2006/0119453 A1 | 6/2006 | Fattinger et al. |
| 2006/0121686 A1 | 6/2006 | Wei et al. |
| 2006/0125489 A1 | 6/2006 | Feucht et al. |
| 2006/0132262 A1 | 6/2006 | Fazzio et al. |
| 2006/0160353 A1 | 7/2006 | Gueneau de Mussy et al. |
| 2006/0164183 A1 | 7/2006 | Tikka et al. |
| 2006/0185139 A1 | 8/2006 | Larson, III et al. |
| 2006/0197411 A1 | 9/2006 | Hoen et al. |
| 2006/0238070 A1 | 10/2006 | Costa et al. |
| 2006/0284707 A1 | 12/2006 | Larson, III et al. |
| 2006/0290446 A1 | 12/2006 | Aigner et al. |
| 2007/0035364 A1 | 2/2007 | Sridhar et al. |
| 2007/0037311 A1 | 2/2007 | Izumi et al. |
| 2007/0080759 A1 | 4/2007 | Jamneala et al. |
| 2007/0084964 A1 | 4/2007 | Sternberger |
| 2007/0085213 A1 | 4/2007 | Ahn et al. |
| 2007/0085447 A1 | 4/2007 | Larson, III et al. |
| 2007/0085631 A1 | 4/2007 | Larson, III et al. |
| 2007/0085632 A1 | 4/2007 | Larson, III et al. |
| 2007/0086080 A1 | 4/2007 | Larson, III et al. |
| 2007/0086274 A1 | 4/2007 | Nishimura et al. |
| 2007/0090892 A1 | 4/2007 | Larson, III et al. |
| 2007/0170815 A1 | 7/2007 | Unkrich |
| 2007/0171002 A1 | 7/2007 | Unkrich |
| 2007/0176710 A1 | 8/2007 | Jamneala et al. |
| 2007/0205850 A1 | 9/2007 | Jamneala et al. |
| 2007/0279153 A1 | 12/2007 | Ruby |
| 2008/0055020 A1 | 3/2008 | Handtmann et al. |
| 2008/0143215 A1 | 6/2008 | Hara et al. |
| 2008/0164186 A1 | 7/2008 | Kang et al. |
| 2008/0297278 A1 | 12/2008 | Handtmann et al. |
| 2008/0297279 A1 | 12/2008 | Thalhammer et al. |
| 2008/0297280 A1 | 12/2008 | Thalhammer et al. |
| 2009/0064498 A1 | 3/2009 | Mok et al. |
| 2009/0079302 A1 | 3/2009 | Wall et al. |
| 2009/0096550 A1 | 4/2009 | Handtmann et al. |
| 2009/0127978 A1 | 5/2009 | Asai et al. |
| 2009/0153268 A1 | 6/2009 | Milson et al. |
| 2010/0013573 A1 | 1/2010 | Umeda |
| 2010/0052176 A1 | 3/2010 | Kamada et al. |
| 2010/0052815 A1 | 3/2010 | Bradley et al. |
| 2010/0091370 A1 | 4/2010 | Mahrt et al. |
| 2010/0102358 A1 | 4/2010 | Lanzieri |
| 2010/0148637 A1 | 6/2010 | Satou |
| 2010/0176899 A1 | 7/2010 | Schaufele et al. |
| 2010/0180391 A1 | 7/2010 | Pruett et al. |
| 2010/0187948 A1 | 7/2010 | Sinha et al. |
| 2010/0187949 A1 | 7/2010 | Pahl et al. |
| 2010/0260453 A1 | 10/2010 | Block |
| 2010/0327697 A1 | 12/2010 | Choy et al. |
| 2010/0327994 A1 | 12/2010 | Choy et al. |
| 2011/0092067 A1 | 4/2011 | Bonilla et al. |
| 2011/0121689 A1 | 5/2011 | Grannen et al. |
| 2011/0204997 A1 | 8/2011 | Elbrecht et al. |
| 2011/0266917 A1 | 11/2011 | Metzger et al. |
| 2012/0218055 A1 | 8/2012 | Burak et al. |
| 2012/0218056 A1 | 8/2012 | Burak |
| 2012/0248941 A1 | 10/2012 | Shirakawa et al. |
| 2013/0003377 A1 | 1/2013 | Sakai et al. |
| 2013/0221454 A1 | 8/2013 | Dunbar, III at al. |
| 2013/0334625 A1 | 12/2013 | Lin |

FOREIGN PATENT DOCUMENTS

| | | |
|---|---|---|
| EP | 231892 | 8/1987 |
| EP | 0637875 | 2/1995 |
| EP | 0689254 | 6/1995 |
| EP | 0865157 | 9/1998 |
| EP | 0880227 | 11/1998 |
| EP | 1096259 | 5/2001 |
| EP | 1100196 | 5/2001 |
| EP | 1047189 | 9/2001 |
| EP | 1180494 | 2/2002 |
| EP | 1249932 | 10/2002 |
| EP | 1258989 | 11/2002 |
| EP | 1258990 | 11/2002 |

(56) References Cited

FOREIGN PATENT DOCUMENTS

| | | |
|---|---|---|
| EP | 1517443 | 3/2005 |
| EP | 1528674 | 5/2005 |
| EP | 1528675 | 5/2005 |
| EP | 1528676 | 5/2005 |
| EP | 1528677 | 5/2005 |
| EP | 1542362 | 6/2005 |
| EP | 1557945 | 7/2005 |
| EP | 1517444 | 8/2005 |
| EP | 1575165 | 9/2005 |
| EP | 2299593 | 3/2011 |
| GB | 1207974 | 10/1970 |
| GB | 2013343 | 8/1979 |
| GB | 2411239 | 8/2005 |
| GB | 2418791 | 4/2006 |
| GB | 2427773 | 1/2007 |
| JP | 59023612 | 2/1984 |
| JP | 61054686 | 3/1986 |
| JP | 62-109419 | 5/1987 |
| JP | 62-200813 | 9/1987 |
| JP | 1-157108 | 6/1989 |
| JP | 1-295512 | 11/1989 |
| JP | 2-10907 | 1/1990 |
| JP | 06005944 | 1/1994 |
| JP | 8-330878 | 12/1996 |
| JP | 09-027729 | 1/1997 |
| JP | 9-83029 | 3/1997 |
| JP | 10-32456 | 2/1998 |
| JP | 10173479 | 6/1998 |
| JP | 10-308645 | 11/1998 |
| JP | 2000-31552 | 1/2000 |
| JP | 2000-0076295 | 3/2000 |
| JP | 2000-232334 | 8/2000 |
| JP | 2000-295065 | 10/2000 |
| JP | 2000-332568 | 11/2000 |
| JP | 2001-102901 | 4/2001 |
| JP | 2001-508630 | 6/2001 |
| JP | 2001-257560 | 9/2001 |
| JP | 2002-515667 | 5/2002 |
| JP | 2002217676 | 8/2002 |
| JP | 2003/017964 | 1/2003 |
| JP | 2003-17974 | 1/2003 |
| JP | 2003-505905 | 2/2003 |
| JP | 2003-505906 | 2/2003 |
| JP | 2003124779 | 4/2003 |
| JP | 2003-332872 | 11/2003 |
| JP | 2005-159402 | 6/2005 |
| JP | 2006-109472 | 4/2006 |
| JP | 2006-295924 | 10/2006 |
| JP | 2006-319796 | 11/2006 |
| JP | 2007-006501 | 1/2007 |
| JP | 2007/028669 | 2/2007 |
| JP | 2007-295306 | 11/2007 |
| KR | 2002-0050729 | 6/2002 |
| KR | 1020030048917 | 6/2003 |
| WO | 98/38736 | 9/1998 |
| WO | 98/56049 | 12/1998 |
| WO | 99-37023 | 7/1999 |
| WO | 01/06646 | 1/2001 |
| WO | WO-01/06647 | 1/2001 |
| WO | WO-01/99276 | 12/2001 |
| WO | WO-02/103900 | 12/2002 |
| WO | WO-03/030358 | 4/2003 |
| WO | WO-03/043188 | 5/2003 |
| WO | WO-03/050950 | 6/2003 |
| WO | 03/058809 | 7/2003 |
| WO | WO-03/058809 | 7/2003 |
| WO | WO-2004/034579 | 4/2004 |
| WO | WO-2004/051744 | 6/2004 |
| WO | WO-2004/102688 | 11/2004 |
| WO | 2005/043752 | 5/2005 |
| WO | WO-2005/043752 | 5/2005 |
| WO | WO-2005/043753 | 5/2005 |
| WO | WO-2005/043756 | 5/2005 |
| WO | WO-2006/018788 | 2/2006 |

OTHER PUBLICATIONS

U.S. Appl. No. 10/971,169, filed Oct. 22, 2004, Larson III, John D., et al.

Holzlohner, Ronald et al., "Accurate Calculation of Eye Diagrams and Bit Error Rates in Optical Transmission Systems Using Linearization", *Journal of Lightwave Technology*, vol. 20, No. 3,, (Mar. 2002),pp. 389-400.

Reinhardt, Alexandre et al., "Design of Coupled Resonator Filters Using Admittance and Scattering Matrices", *2003 IEEE Ultrasonics Symposium*, (May 3, 2003), 1428-1431.

Ivensky, Gregory et al., "A Comparison of Piezoelectric Transformer AC/DC Converters with Current Doubler and voltage Doubler Rectifiers", *IEEE Transactions on Power Electronics*, vol. 19, No. 6., (Nov. 2004).

Lakin, K.M. "Coupled Resonator Filters", *2002 IEEE Ultrasonics Symposium*, (Mar. 2, 2002),901-908.

Lakin, K.M. et al., "High Performance Stacked Crystal Filters for GPS and Wide Bandwidth Applications", *2001 IEEE Ultrasonics Symposium*, (Jan. 1, 2001),833-838.

Krishnaswamy, S.V. et al., "Film Bulk Acoustic Wave Resonator Technology", (May 29, 1990),529-536.

Lobl, H.P. et al., "Piezoelectric Materials for BAW Resonators and Filters", *2001 IEEE Ultrasonics Symposium*, (Jan. 1, 2001),807-811.

Yang, C.M. et al., "Highly C Axis Oriented AlN Film Using MOCVD for 5GHx Band FBAR Filter", *2003 IEEE Ultrasonics Symposium*, (Oct. 5, 2003),pp. 170-173.

Martin, Steven J., et al., "Development of a Low Dielectric Constant Polymer for the Fabrication of Integrated Circuit Interconnect", *12 Advanced Materials*, (Dec. 23, 2000), 1769-1778.

Hadimioglu, B. et al., ""Polymer Films As Acoustic Matching Layers".", *1990. IEEE Ultrasonics Symposium Proceedings*, vol. 3 PP., [Previously Submitted as "Polymer Files as Acoustic Matching Layers, 1990 IEEE Ultrasonics Symposium Proceeding, vol. 4 pp. 1227-1340, Dec. 1990". Considered by examiner on Mar. 20, 2007,(Dec. 1990),1337-1340.

"Search Report from corresponding application No.", GB 0605779.8, (Aug. 23, 2006).

"Examination Report from UK for application", GB 0605971.1, (Aug. 24, 2006).

"Examination report corresponding to application No.", GB0605770.7, (Aug. 25, 2006).

"Examination Report corresponding to application No.", GB0605775.6, (Aug. 30, 2006).

"Search report from corresponding application No.", GB0620152.9, (Nov. 15, 2006).

"Search report from corresponding application No.", GB0620655.1, (Nov. 17, 2006).

"Search report from corresponding application No.", GB0620653.6, (Nov. 17, 2006).

"Search Report from corresponding application No.", GB0620657.7, (Nov. 23, 2006).

"GB Search Report for", Application No. GB0522393.8, (Jan. 9, 2006),4 pages.

"GB Search Report for Application No.", GB0525884.3, (Feb. 2, 2006),4 pgs.

"British Search Report Application No.", 0605222.9, (Jul. 11, 2006).

Tiersten, H. F., et al., "An Analysis of Thiskness-Extensional Trapped Energy Resonant Device Structures with Rectangular Electrodes in the Piezoelectric Thin Film on Silicon Configuration", *J. Appl. Phys.* 54 (10), (Oct. 1983),5893-5910.

"Search Report from corresponding application", No. GB0605225.2.

"Search Report for Great Britain Patent Application", No. 0617742.2, (Mar. 29, 2007).

"Search Report for Great Britain Patent Application", No. 0617742.2, (Dec. 13, 2006).

"Search Report in the Great Britian Patent Application", No. 0619698.4, (Nov. 30, 2006).

(56) References Cited

OTHER PUBLICATIONS

Ruby, R. et al., "The Effect of Perimeter Geometry on FBAR Resonator Electrical Performance", *Microwave Symposium Digest, 2005 IEEE MTT-S International*, (Jun. 12, 2005),217-221.
Schuessler, Hans H., "Ceramic Filters and Resonators", Reprinted from *IEEE Trans. Sonics Ultrason.*, vol. SU-21, (Oct. 1974),257-268
Larson III, J. D., et al., "Measurement of Effective Kt2q,RpRs vs. Temperature for Mo/AlN/Mo Resonators", *2002 IEEE Ultrasonics Symposium*, Munich, Germany, (Oct. 2002),915-919.
Parker, T. E., et al., "Temperature-Compensated Surface Acoustic-Wave Devices with SiO2 Film Overlays", *J. Appl. Physics*, vol. 50, (1360-1369),Mar. 1979.
Lakin, K. M., "Thin Film Resonators and Filters", *IEEE Untrasonics Symposium*, Caesar's Tahoe, NV, (Oct. 1999),895-906.
Lakin, K. M., et al., "Temperature Compensated Bulk Acoustic Thin Film Resonators", *IEEE Ultrasonics Symposium*, San Juan, Puerto Rico, (Oct. 2000),855-858.
Ohta, S. et al., "Temperature Characteristics of Solidly Mounted Piezoelectric Thin Film Resonators", *IEEE Ultrasonics Symposium*, Honolulu, HI, (Oct. 2003),2011-2015.
Bauer, L. O., et al., "Properties of Silicon Implanted with Boron Ions through Thermal Silicon Dioxide", *Solid State Electronics*, vol. 16, No. 3, (Mar. 1973),289-300.
Topich, J. A., et al., "Effects of Ion Implanted Flourine in Silicon Dioxide", *Nuclear Instr. And Methods, Cecon Rec*, Cleveland, OH, (May 1978),70-73.
Aoyama, Takayuki et al., "Diffusion of Boron, Phosphorous, Arsenic and Antimony in Thermally Grown SiliconDioxide", *Journal of the Electrochemical Society*, vol. 146, No. 5 1999 , 1879-1883.
Auld, B. A. , "Acoustic Resonators", *Acoustic Fields and Waves in Solids, Second Edition*, vol. II 1990 , 250-259.
Choi, Sungjin et al., "Design of Half-Bridge Piezo-Transformer Converters in the AC Adapter Applications", *IEEE 2005* , 244-248.
Coombs, Clyde F. , "Electronic Instrument Handbook", *Second Edition, McGraw-Hill, Inc.* 1995 , pp. 5.1-5.29.
Fattinger, G. G. et al., "Coupled Bulk Acoustic Wave Resonator Filters: Key technology for single-to-balanced RF filters", 0-7803-8331-1/4/W20.00; *IEEE MTT-S Digest* 2004 , 927-929.
Hara, K. , "Surface Treatment of Quartz Oscillator Plate by Ion Implantation", *Oyo Buturi*, vol. 47, No. 2 Feb. 1978 , 145-146.
Jiang, Yimin et al., "A Novel Single-Phase Power Factor Correction Scheme", *IEEE* 1993 , 287-292.
Jung, Jun-Phil et al., "Experimental and Theoretical Investigation on the Relationship Between AlN Properties and AlN-Based FBAR Characteristics", *2003 IEEE International Frequency Control Symposium and PDA Exhibition Jointly with the 17th European Frequency and Time Forum* Sep. 3, 2003 , 779-784.
Lakin, K.M. , "Bulk Acoustic Wave Coupled Resonator Filters", *2002 IEEE International Frequency Control Symposium and PDA Exhibition* Jan. 2, 2002 , 8-14.
Lakin, K.M. , "Thin Film BAW Filters for Wide Bandwidth and High Performance Applications", *IEEE Microwave Symposium Digest;* vol. 2 Jun. 6-11, 2004 , 923-926.
Lakin, et al., "Wide Bandwidth Thin Film BAW Filters", *2004 IEEE Ultrasonics Symposium*, vol. 1, Aug. 2004 , 407-410.
Li, Yunxiu et al., "AC-DC Converter with Worldwide Range Input Voltage by Series and Parallel Piezoelectric Transformer Connection", *35th Annual IEEE Power Electronics Specialists Conference* 2004.
Navas, J. et al., "Miniaturised Battery Charger using Piezoelectric Transformers", *IEEE* 2001 , 492-496.
NG, J. et al., "The Diffusion Ion-Implanted Boron in Silicon Dioxide", *AIP Conf. Proceedings*, No. 122 1984 , 20-33.
Pang, W. et al., "High Q Single-Mode High-Tone Bulk Acoustic Resonator Integrated With Surface-Machined FBAR Filter", *Microwave Symposium Digest, IEEE MTT-S International* 2005 , 413-416.
Ruby, R. C. , "MicroMachined Thin Film Bulk Acoustic Resonators", *IEEE International Frequency Control Symposium* 1994 , 135-138.

Sanchez, a.M. et al., "Mixed analytical and numerical design method for piezoelectric transformers", *IEEE,PESX* Jun. 2003 , 841-846.
Spangenberg, B. et al., "Dependence of the Layer Resistance of Boron Implantation in Silicon and the Annealing Conditions", *Comptus Rendus de l'Academic Blugare des Sciences*, vol. 33, No. 3, 1980 , 325-327.
Tsubbouchi, K. et al., "Zero Temperature coefficient Surface Acoustic Wave Devices using Epitaxial AlN Films", *IEEE Ultrasonic symposium*, San Diaego, CA, 1082 1982 , 240-245.
Vasic, D et al., "A new MOSFET & IGBT Gate Drive Insulated by a Piezoelectric Transformer", *IEEE 32 nd Annual Power Electronics SPecialists Conference*, 2001 vol. 3 Jun. 17-21, 2003 , 1479-1484.
Vasic, D et al., "A New Mothod to Design Piezoelectric Transformer Uned to MOSFET & IGBT Drive Circuits", *IEEE 34th ANuual Power Electronics Specialists Conference*, 2003 vol. 1 Jun. 15-19, 2003 , 307-312.
Al-Ahmad, M. et al., "Piezoelectric-Based Tunable Microstrip Shunt Resonator", *Proceedings of Asia-Pacific Microwave Conference* 2006.
Co-pending U.S. Appl. No. 12/710,640, filed Feb. 23, 2010.
Co-pending U.S. Appl. No. 13/036,489, filed Feb. 28, 2011.
Co-pending U.S. Appl. No. 13/074,094, filed Mar. 29, 2011.
Co-pending U.S. Appl. No. 13/074,262, filed Mar. 29, 2011.
Co-pending U.S. Appl. No. 13/101,376, filed May 5, 2011.
Co-pending U.S. Appl. No. 13/161,946, filed Jun. 16, 2011.
Co-pending U.S. Appl. No. 13/286,038, filed Oct. 31, 2011.
Akiyama, et al., "Enhancement of piezoelectric response in scandium aluminum nitride alloy thin films prepared by dual reactive cosputtering", Advanced Materials, vol. 21, 2009, 593-596.
Bi, "Bulk Acoustic Wave RF Technology", IEEE Microwave Magazine, vol. 9, Issue 5., 2008, 65-80.
Chen, "Fabrication and Characterization of ALN Thin Film Bulk Acoustic Wave Resonator", Dissertation, University of Pittsburgh School of Engineering, 2006.
C-S Lee, et al., "Copper-Airbridged Low-Noise GaAs PHEMT With Ti/WN$_x$/Ti Diffusion Barrier for High-Frequency", IEEE Transactions on Electron Devices, Volume: 53 , Issue: 8., 2006, 1753-1758.
Denisse, et al., "Plasma-Enhanced Growth and Composition of Silicon Oxynitride Films", J. Appl. Phys., vol. 60, No. 7., Oct. 1, 1986, 2536-2542.
Fattinger, et al., "Single-To-Balance Filters for Mobile Phones Using Coupled Resonator BAW Technology", 2004 IEEE Ultrasonics Symposium, Aug. 2004, 416-419.
Fattinger, et al., "Spurious Mode Suppression in Coupled Resonator Filters", IEEE MTT-S International Microwave Symposium Digest, 2005, 409-412.
Gilbert, "An Ultra-Miniature, Low Cost Single Ended to Differential Filter for ISM Band Applications", Micro. Symp. Digest, 2008 IEEE MTT-S, Jun. 2008, 839-842.
Grill, et al., "Ultralow-K Dielectrics Prepared by Plasma-Enhanced Chemical Vapor Deposition", App. Phys. Lett, vol. 79, 2001, 803-805.
Jamneala, et al., "Coupled Resonator Filter with Single-Layer Acoustic Coupler", IEEE Transaction on Ultrasonics, Ferroelectrics, and Frequency Control, vol. 55, Oct. 2008, 2320-2326.
Jamneala, et al., "Ultra-Miniature Coupled Resonator Filter with Single-Layer Acoustic Coupler", IEEE Transactions on Ultrasonics, Ferroelectrics, and Frequency Control, vol. 56, No. 11., Nov. 2009, 2553-2558.
Kaitila, et al., "Measurement of Acoustical Parameters of Thin Films", 2006 IEEE Ultrasonics Symposium, Oct. 2006, 464-467.
Lee, et al., "Optimization of Frame-Like Film Bulk Acoustic Resonators for Suppression of Spurious Lateral Modes Using Finite Element Method", IEEE Ultrasonic Symposium, vol. 1, 2004, 278-281.
Loboda, "New Solutions for Intermetal Dielectrics Using Trimethylsilane-Based PECVD Processes", Microelectronics Eng., vol. 50., 2000, 15-23.
Lynch, "Precise Measurements On Dielectric And Magnetic Materials", IEEE Transactions On Instrumentation and Measurement, Dec. 1974, 425-431.
Martin, et al., "Re-growth of C-Axis Oriented AlN Thin Films", IEEE Ultrasonics Symposium, 2006, 169-172.

(56) References Cited

OTHER PUBLICATIONS

Martin, et al., "Shear Mode Coupling and Tilted Gram Growth of AlN Thin Films in BAW Resonators", IEEE Transactions on Ultrasonics, Ferroelectrics, and Frequency Control, vol. 53, No. 7, Jul. 2006, 1339-1343.

Martinez, et al., "High confinement suspended micro-ring resonators in silicon-on-insulator", Optics Express, Vo. 14, No. 13, Jun. 26, 2006, 6259-6263.

Pandey, et al., "Anchor Loss Reduction in Resonant MEMS using MESA Structures", Proceedings of the 2nd IEEE International Conference on Nano/Micro Engineered and Molecular Systems, Bangkok, Thailand, Jan. 16-19, 2007, 880-885.

Pensala, et al., "Spurious resonance supression in gigahertz-range ZnO thin-film bulk acoustic wave resonators by the boundary frame method: modeling and experiment", IEEE Transactions on Ultrasonics, Ferroelectrics, and Frequency Control, vol. 56, No. 8, Aug. 2009, 1731-1744.

Pensala, "Thin film bulk acoustic wave devices: performance optimization and modeling", http://www.vtt.fi/inf/pdf/publications/2011/P756.pdf.

Schoenholz, et al., "Plasma-Enhanced Deposition of Silicon Oxynitride Films", Thin Solid Films, 1987, 285-291.

Shirakawa, et al., "Bulk Acoustic Wave Coupled Resonator Filters Synthesis Methodology", 2005 European Microwave Conference, vol. 1, Oct. 2005.

Small, et al., "A De-Coupled Stacked Bulk Acoustic Resonator (DSBAR) Filter with 2 dB Bandwidth >4%", 2007 IEEE Ultrasonics Symposium, Oct. 2007, 604-607.

Tas, et al., "Reducing Anchor Loss in Micromechanical Extensional Mode Resonators", IEEE Transactions on Ultrasonics, Ferroelectrics and Frequency Control, vol. 57, No. 2., Feb. 2010, 448-454.

Thomsen, et al., "Surface Generation and Detection of Phonons by Picosecond Light Pulses", Phys. Rev. B, vol. 34, 1986, 4129.

Yanagitani, et al., "Giant Shear Mode Electromechanical Coupling Coefficient k15 in C-Axis Tilted ScAlN Films", IEEE International Ultrasonics Symposium, 2010.

\* cited by examiner

400

403

PIEZOELECTRIC RESONATOR STRUCTURES AND ELECTRICAL FILTERS HAVING FRAME ELEMENTS

CROSS-REFERENCE TO RELATED APPLICATION

The present application is a continuation-in-part (CIP) under 37 C.F.R. §1.53(b) of commonly-assigned Ser. No. 10/990,201, now U.S. Pat. No. 7,280,007, entitled "THIN FILM BULK ACOUSTIC RESONATOR WITH A MASS LOADED PERIMETER" to Hongjun Feng, et al., and filed on Nov. 15, 2004. Priority is claimed under 35 U.S.C. §120 to this parent application and the entire disclosure of this parent application is specifically incorporated herein by reference.

BACKGROUND

In many electronic applications, electrical resonators are used. For example, in many wireless communications devices, radio frequency (rf) and microwave frequency resonators are used as filters to improve reception and transmission of signals. Filters typically include inductors and capacitors, and more recently resonators.

As will be appreciated, it is desirable to reduce the size of components of electronic devices. Many known filter technologies present a barrier to overall system miniaturization. With the need to reduce component size, a class of resonators based on the piezoelectric effect has emerged. In piezoelectric-based resonators, acoustic resonant modes are generated in the piezoelectric material. These acoustic waves are converted into electrical waves for use in electrical applications.

One type of piezoelectric resonator is a Film Bulk Acoustic Resonator (FBAR). The FBAR has the advantage of small size and lends itself to Integrated Circuit (IC) manufacturing tools and techniques. The FBAR includes an acoustic stack comprising, inter alia, a layer of piezoelectric material disposed between two electrodes. Acoustic waves achieve resonance across the acoustic stack, with the resonant frequency of the waves being determined by the materials in the acoustic stack.

FBARs are similar in principle to bulk acoustic resonators such as quartz, but are scaled down to resonate at GHz frequencies. Because the FBARs have thicknesses on the order of microns and length and width dimensions of hundreds of microns, FBARs beneficially provide a comparatively compact alternative to known resonators.

Desirably, the bulk acoustic resonator excites only thickness-extensional (TE) modes, which are longitudinal mechanical waves having propagation (k) vectors in the direction of propagation. The TE modes desirably travel in the direction of the thickness (e.g., z-direction) of the piezoelectric layer.

Unfortunately, besides the desired TE modes there are lateral modes, known as Rayleigh-Lamb modes, generated in the acoustic stack as well. The Rayleigh-Lamb modes are mechanical waves having k-vectors that are perpendicular to the direction of TE modes, the desired modes of operation. These lateral modes travel in the areal dimensions (x, y directions of the present example) of the piezoelectric material.

Among other adverse effects, lateral modes deleteriously impact the quality (Q) factor (often referred to simply as 'Q') of an FBAR device. In particular, the energy of Rayleigh-Lamb modes is lost at the interfaces of the FBAR device. As will be appreciated, this loss of energy to spurious modes is a loss in energy of desired longitudinal modes, and ultimately a degradation of the Q-factor.

While attempts have been made to improve the insertion loss as well as the quality (Q) factor of known FBARs, certain drawbacks remain. What are needed, therefore, are an acoustic resonator structure and an electrical filter that overcomes at least the known shortcomings described above.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DEFINED TERMINOLOGY

The terms 'a' or 'an', as used herein are defined as one or more than one.

The term 'plurality' as used herein is defined as two or more than two.

DETAILED DESCRIPTION

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the illustrative embodiments. Such methods and apparati are clearly within the scope of the present teachings.

Figure 1:
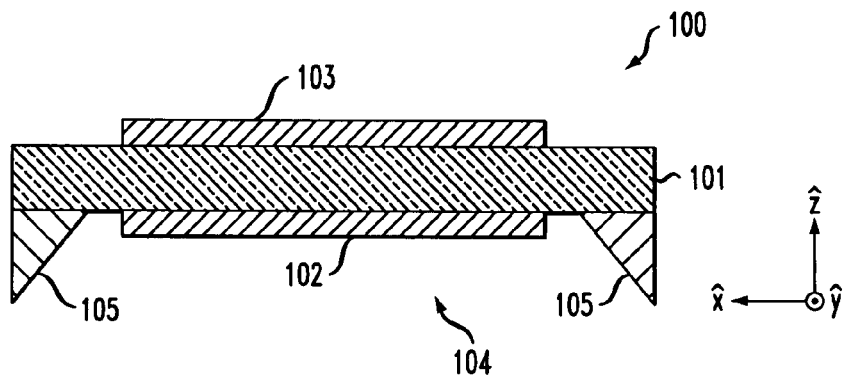
FIG. 1 is a cross-sectional view of a resonator structure in accordance with a representative embodiment.

FIG. 1 is a cross-sectional view of an electrical resonator structure 100 in accordance with an illustrative embodiment. Illustratively, the electrical resonator structure 100 is an FBAR structure. The electrical resonator structure 100 includes a layer of piezoelectric material 101 (also referred to as a piezoelectric element) having a first surface in contact with a first electrode 102 and a second surface in contact with a second electrode 103. The first and second electrodes 102, 103 include an electrically conductive material and provide an oscillating electric field in the z-direction, which is the direction of the thickness of the layer of piezoelectric material 101. As described more fully herein, in the present illustrative embodiment, the z-axis is the axis for the TE (longitudinal) mode(s) for the resonator.

The layer of piezoelectric material 101 and first and second electrodes 102,103 are suspended over a cavity 104 formed by the selective etching of a substrate 105, which may be silicon or other semiconductor, or other suitable material. Accordingly, the electrical resonator structure 100 is a mechanical resonator, which can be electrically coupled via the piezoelectric layer. When connected to other electrical resonator structures_100 the resulting array of resonators can act as an electrical filter. Other suspension schemes that allow the FBARs to resonate mechanically are possible. For example, the electrical resonator structure 100 can be located over a mismatched acoustic Bragg reflector (not shown) formed in or on a substrate, as disclosed by Lakin in U.S. Pat. No. 6,107,721, the disclosure of which is specifically incorporated into this disclosure by reference in its entirety.

The electrical_resonator structure 100 may be fabricated according to known semiconductor processing methods and using known materials. Illustratively, the electrical resonator structure 100 may be fabricated according to the teachings of U.S. Pat. Nos. 5,587,620, 5,873,153 and U.S. Pat. No. 6,507,983 to Ruby, et al. The disclosures of these patents are specifically incorporated herein by reference. It is emphasized that the methods and materials described in these patents are representative and other methods of fabrication and materials within the purview of one of ordinary skill in the art are contemplated.

The fundamental mode of a film bulk acoustic resonator (FBAR) is the longitudinal extension mode or "piston" mode. This mode is excited by the application of a time-varying voltage to the two electrodes at the resonant frequency of the FBAR. The piezoelectric material converts energy in the form of electrical energy into mechanical energy. In an ideal FBAR having infinitesimally thin electrodes, resonance occurs when the applied frequency is equal to the velocity of sound of the piezoelectric medium divided by twice the thickness of the piezoelectric medium: $f=v_{ac}/(2*T)$, where T is the thickness of the piezoelectric medium and $v_{ac}$ is the acoustic phase velocity. For resonators with finite thickness electrodes, this equation is modified by the weighted acoustic velocities and thicknesses of the electrodes.

A quantitative and qualitative understanding of the Q of a resonator may be obtained by plotting on a Smith Chart the ratio of the reflected energy to applied energy as the frequency is varied for the case in which one electrode is connected to ground and for an FBAR resonator with an impedance equal to the system impedance at the resonant frequency. As the frequency of the applied energy is increased, the magnitude/phase of the FBAR resonator sweeps out a circle on the Smith Chart. This is referred to as the Q-circle. Where the Q-circle first crosses the real axes (horizontal axes), this corresponds to the frequency of the piston mode $f_s$. The real impedance (as measured in Ohms) is $R_s$. As the Q-circle continues around the perimeter of the Smith chart, it again crosses the real axes. The second point at which the Q circle crosses the real axis is labeled $f_p$, the anti-resonant frequency of the FBAR. The residual real part of the impedance is $R_p$.

For filter applications, it is desirable to minimize $R_s$ while maximizing $R_p$. Qualitatively, the closer the Q-circle "hugs" the rim of the Smith chart, the higher the Q of the device. If there were such a thing as a lossless resonator, its Q-circle would have a radius of one and would be at the edge of the Smith chart. However, there are losses that impact the Q of the device. For instance, Rayleigh-Lamb (lateral or spurious) modes exist in the x,y dimensions of the piezoelectric element 101. These lateral modes are due to interfacial mode conversion of the longitudinal mode traveling in the z-direction; and due to the creation of non-zero propagation vectors, $k_x$ and $k_y$, for both the TE mode and the various lateral modes (e.g., the S0 mode and the zeroth and first flexure modes, A0 and A1), which are due to the difference in effective velocities between the regions where electrodes are disposed and the surrounding regions of the resonator where there are no electrodes.

Regardless of their source, the lateral modes are parasitic in many resonator applications. For example, the parasitic lateral modes couple at the interfaces of the resonator and remove energy available for the longitudinal modes and thereby reduce the Q-factor of the resonator device. Notably, as a result of parasitic lateral modes sharp reductions in Q can be observed on a Q-circle of the Smith Chart of the $S_{11}$ parameter. These sharp reductions in Q are known as "rattles" or "loop-de-loops," which are shown and described in the parent application.

As described more fully in the parent application, an annulus creates an acoustic impedance mismatch that causes reflections of the lateral modes at the interfaces of the resonator. Beneficially, because coupling of these lateral modes out of the resonator is reduced, energy loss to lateral modes can be mitigated. Moreover, at least a portion of reflected lateral modes are usefully converted to longitudinal modes through mode conversion. Ultimately, this results in an overall improvement in the Q-factor.

While the teachings of the parent application beneficially provide an increase in the overall Q-factor of FBAR devices, there can be a degradation in the effective coupling coefficient, $kt^2$, as a result of the annulus. In some applications, it may be useful to mitigate this degradation, even though the improvement in the Q-factor may not be as great. For instance, it is known that the bandwidth of an FBAR filter is related to $kt^2$. As such, a degradation of $kt^2$ can reduce the bandwidth of the FBAR filter. Certain representative embodiments, described presently provide allow for a trade-off of an acceptable Q-factor and an acceptable degradation of $kt^2$.

Figure 2A:
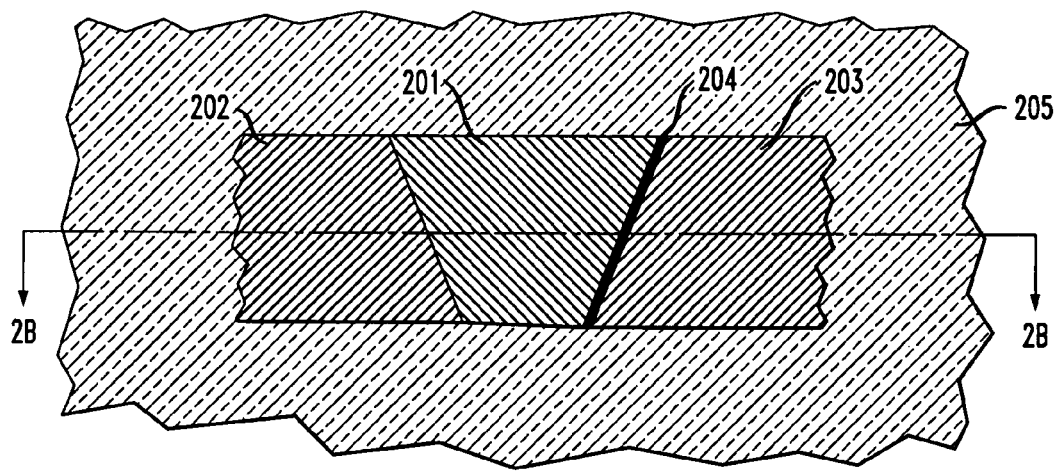
FIG. 2A is a top view of a resonator structure in accordance with a representative embodiment.

FIG. 2A is a top view of an electrical resonator structure 200 in accordance with a representative embodiment. The electrical resonator structure 200 includes an upper electrode 201 having a plurality of sides. The upper electrode 201 is illustratively apodized in accordance with the teachings of U.S. Pat. No. 6,215,375 to Larson III, et al; or U.S. Pat. No. 7,629,865 entitled "Piezoelectric Resonator Structures and Electrical Filters" filed May 31, 2006, to Richard C. Ruby; or "The Effect of Perimeter Geometry on FBAR Resonator Electrical Performance" to Richard Ruby, et al. Microwave Symposium Digest, 2005 IEEE MTT-S International, pages 217-221 (Jun. 12, 2005). The disclosures of this patent and paper are specifically incorporated herein by reference in their entirety.

The electrical resonator structure 200 also includes an upper connection 203 to the upper electrode 201, and a lower connection 202 to a lower electrode (not shown in FIG. 2A). In the present representative embodiment, a frame element 204 is disposed over the upper electrode 201 and along the interface of the upper electrode 201 and the upper connection 203. While only one frame element 204 is shown in the embodiment of FIG. 2A, additional frame elements may be disposed along other sides of the upper electrode 201. Notably, the present teachings contemplate providing frame element 204 along the side of the upper electrode 201 at its interface with the upper connection 203, and providing additional frame elements (not shown in FIG. 2A, see for example FIG. 2C) along other sides of the upper electrode 201 as desired. However, frame elements 204 are not disposed along all sides of the upper electrode (i.e., not forming an annulus). The frame element 204 may be comprised of materials and fabricated according to the teachings of the parent application. Moreover, the dimensions and arrangement of the frame element 204 may be similar to those described in connection with the annulus of the parent application. These details are omitted in order to avoid obscuring the description of the representative embodiments.

Figure 2B:
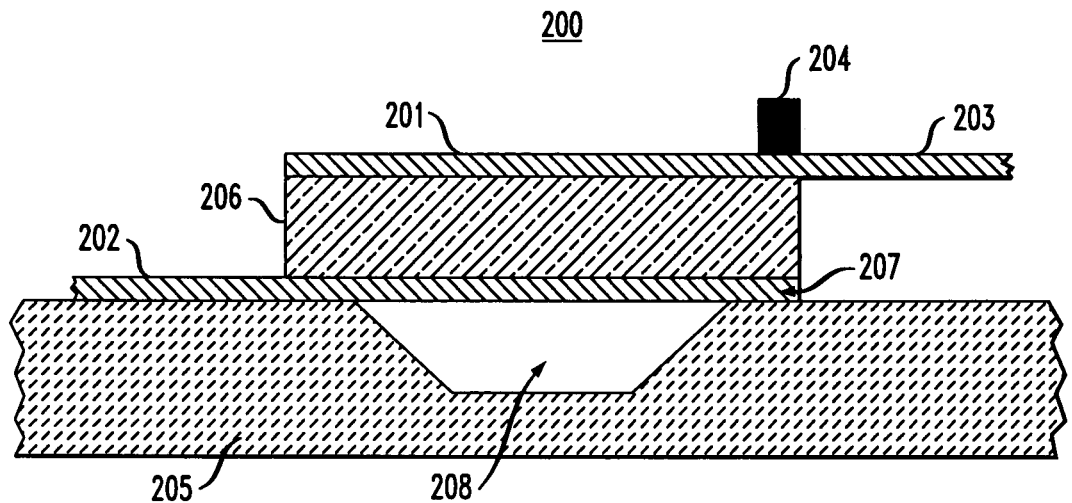
FIG. 2B is a cross-sectional view of the resonator structure of FIG. 2A taken along the line 2B-2B.
Figure 2C:
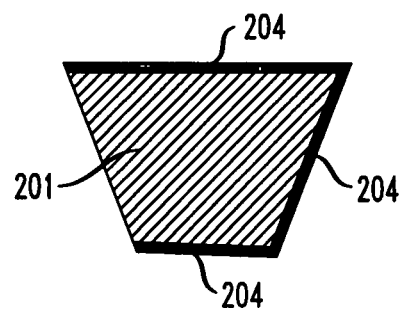
FIG. 2C is a top view of an electrode in accordance with a representative embodiment.

FIG. 2B is a cross-sectional view of the electrical resonator structure 200 taken along line 2B-2B. The electrical resonator structure 200 includes a piezoelectric element 206 disposed over a lower electrode 207. The lower electrode 207 is apodized in substantially the same manner and is of substantially the same shape and dimensions as the upper electrode 201; and the area of overlap of the upper and lower electrodes 201, 207 defines the active area of the electrical resonator structure 200. The electrical resonator structure 200 is disposed over a cavity 208 (or over Bragg element) formed in a substrate 205.

As is known, boundary conditions govern the lateral mode loss at the interfaces/boundaries of the electrical resonator structure 200. As will be appreciated, during fabrication of each component of the electrical resonator structure 200, defects may occur that impact the topology of the interface and thus the boundary conditions of the interface. For example, the interface of the upper electrode 201 and the upper connection 203 inherits the defects of each element/layer in the stack of layers forming the electrical resonator structure 200. Due to the topology and attendant boundary conditions at the interface of the upper electrode 201 and the upper connection 203, coupling of lateral modes and the attendant loss of energy can be most significant at the interface of the upper electrode 201 and the upper connection 203, when compared to lateral mode loss at other sides/interfaces of the electrical resonator structure 200.

In accordance with a representative embodiment, frame element 204 is disposed over the upper electrode 201 and at the interface of the upper electrode 201 and the upper connection 203 to provide an acoustic impedance mismatch between the upper electrode 201 and the upper connection 203. This results in a significant portion of the lateral modes' being reflected at the interface. Thus, at least a portion of the lateral mode energy is not transmitted (coupled) through the upper connection 203 and not lost. As such, a potentially significant source of energy loss due to lateral mode coupling can be avoided. Moreover, reflected lateral modes can be converted to longitudinal modes. Ultimately, this can result in a significant improvement in the Q factor of the electrical resonator structure 200 compared to resonators not including the frame element 204.

As noted previously, although useful in improving Q, the inclusion of frame elements over the upper electrode 201 at other interfaces of the sides of the electrode can degrade kt². As such, a trade-off is struck between an interest in improving the Q-factor and an interest of avoiding degrading kt² and the disadvantages thereof (e.g., degradation of filter bandwidth). At minimum, the frame element 204 is included to reduce energy loss to spurious modes coupled through the interface of the upper electrode 201 and the upper connection 203. However, as shown in the illustrative embodiment of FIG. 2C, frame elements 204 may be disposed along other sides/interfaces (but not along all sides) of the upper electrode 201.

Figure 3A:
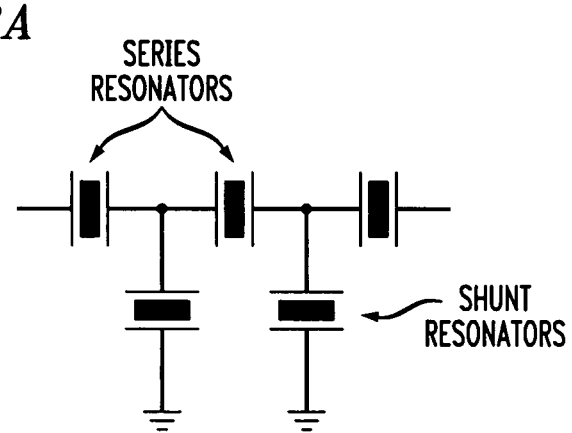
FIGS. 3A and 3B are simplified schematic diagrams of a half-ladder filter and a full ladder filter, respectively, in accordance with representative embodiments.
Figure 3B:
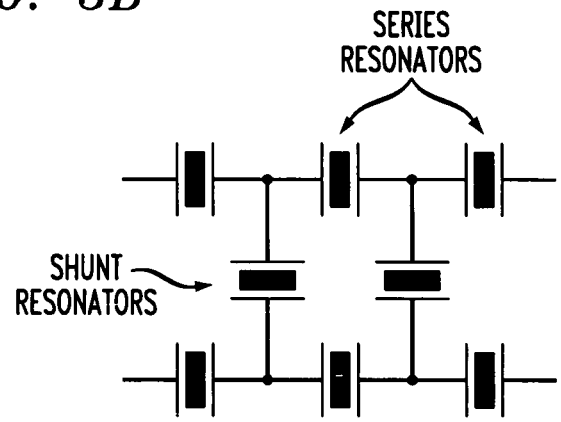

FIGS. 3A and 3B are simplified schematic diagrams of a half-ladder filter and a full ladder filter, respectively, in accordance with representative embodiments. The ladder filters of FIGS. 3A and 3B may be comprised of a plurality of electrical resonator structures 200 described previously. As the details of ladder filters are known, these are omitted in order to avoid obscuring the teachings of the present representative embodiments. Moreover, it is emphasized that the inclusion of resonators of the representative embodiments into other filters within the purview of ordinary skill in the art is contemplated.

Figure 4A:
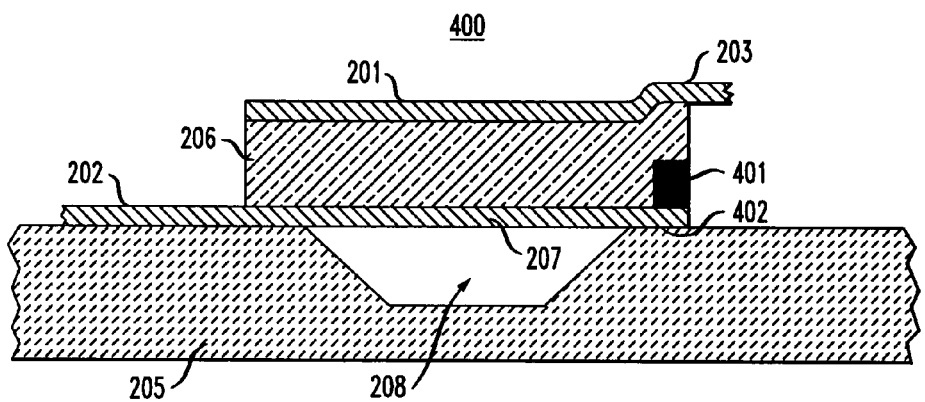
FIG. 4A is a cross-sectional view of a resonator structure in accordance with a representative embodiment.

FIG. 4A is a cross-sectional view of an electrical resonator structure 400 in accordance with a representative embodiment. The electrical resonator structure 400 includes many features and details common to the electrical resonator structures described in connection with FIGS. 1-2B, and may be used in filters such as described in connected with FIGS. 3A and 3B. The description of these common features and details is generally omitted to avoid obscuring the description of the present embodiment.

As noted previously, due to the topology and attendant boundary conditions at the interface of the upper electrode 201 and the upper connection 203, coupling of lateral modes and the attendant loss of energy can be most significant at the interface of the upper electrode 201 and the upper connection 203, when compared to lateral mode loss at other sides/interfaces of the resonator structure. In the present embodiment, a frame element 401 is disposed along a side of the lower electrode 207 and along the interface of the upper electrode 201 and the upper connection 203 to provide an acoustic impedance mismatch between the upper electrode 201 and the upper connection 203. This results in a significant portion of the lateral modes' being reflected at the interface. Thus, at least a portion of the lateral mode energy is not transmitted (coupled) through the upper connection 203 and not lost. As such, a potentially substantially source of energy loss due to lateral mode coupling can be significantly avoided. Moreover, reflected lateral modes can be converted to longitudinal modes. Ultimately, this can result in a significant improvement in the Q factor of the electrical resonator structure 400 compared to resonators not including the frame element 401.

In the embodiment shown and described in FIG. 4A, the frame element 401 is disposed over the lower electrode 207 at the interface of the upper electrode 201 and the upper connection 203. However, this is merely illustrative and providing the frame element 401 along other sides of the lower electrode 207 is contemplated. For example, rather than fabricating the frame element 401 over the lower electrode 207 as shown, the frame element 401 may be disposed beneath the lower electrode 207, such as over the lower surface 402 of the lower electrode 207.

Moreover, the present embodiments contemplate locating frame elements (not shown in FIG. 4A) along other sides of the lower electrode 207. Notably, the present teachings contemplate providing a frame element(s) disposed along at least one side but not all sides of the lower electrode 207. To this end, as noted previously, the lower electrode 207 is substantially the same in shape and dimension as the upper electrode 201. Thus, frame elements may be disposed along the sides of the lower electrode in much the same manner as described in conjunction with the embodiments of FIGS. 2A-2C. Like frame element 401, these additional frame elements may be disposed over the lower electrode 207 as shown in FIG. 4A, or over a lower surface 402 of the lower electrode 207.

Figure 4B:
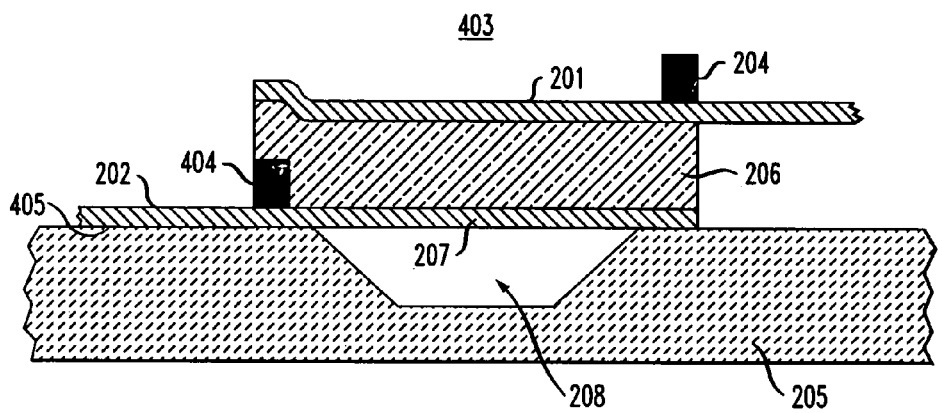
FIG. 4B is a cross-sectional view of a resonator structure in accordance with a representative embodiment.

FIG. 4B is a cross-sectional view of an electrical resonator structure 403 in accordance with a representative embodiment. The electrical resonator structure 403 includes many features and details common to the resonator structures described in connection with FIGS. 1-2B and 4A, and may be used in filters such as described in connected with FIGS. 3A and 3B. The description of these common features and details is generally omitted to avoid obscuring the description of the present embodiment.

As will be appreciated, another location of potentially significant lateral mode coupling in resonator structures such as electrical resonator structures 200, 400, 403 is along the interface of the lower electrode 207 and lower connection 202. In the present embodiment, a frame element 404 is provided over the lower electrode 207 and along the interface of the lower electrode 207 and the lower connection 202. Frame element 404 provides acoustic impedance mismatch to curb energy loss due to coupling of lateral modes through the lower connection 202. As described previously, this fosters an improved Q-factor.

In the embodiment described in conjunction with FIG. 4B, one frame element (frame element 204) is disposed along a side of the upper electrode 201 and another frame element (frame element 404) is disposed along a side of the lower electrode 207. As described previously, the present teachings contemplate providing a frame element(s) along at least one side but not all sides of the upper electrode or the lower electrode.

The present teachings also contemplate providing a combination of frame elements along sides of the upper and lower electrodes 201, 207, so that, in combination, at least one side of either the upper electrode 201 or lower electrode 207 includes a frame element. As will be appreciated upon review of the present disclosure, various combinations are possible. To this end, as noted previously, the upper and lower electrodes 201, 207 are substantially the same shape and size. Thus, for each side of the upper electrode 201 there is a corresponding side of the lower electrode 207. The present teachings contemplate that a frame element may be disposed along one or more of the corresponding sides of the upper electrode 201 or the lower electrode 207. However, if a frame element is disposed along a side of the upper electrode 201, no frame element is provided along the corresponding side of the lower electrode 207. For example, as shown in FIGS. 4A and 4B, frame element 404 may be disposed along a side of the lower electrode 207. However, if the frame element 404 is disposed along a side of the lower electrode 207, frame element 204 would not be disposed along the corresponding side of the upper electrode 201. As will be appreciated, various combinations and permutations of the placement of frame elements are possible according to the present teachings. The selection of the number and placement of frame elements may be dictated by a desired trade-off between acceptable improvement of Q and acceptable degradation of $kt^2$.

In accordance with illustrative embodiments, electrical resonators and filter elements are described having at least one frame element disposed along a corresponding at least one side but not all sides of the upper electrode. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:
1. An electrical resonator, comprising:
a first electrode having a plurality of sides;
a second electrode having the plurality of sides;
a piezoelectric element disposed between the first and second electrodes; and
at least one raised frame element disposed between the first electrode and the second electrode and along a corresponding at least one side but not all sides of the first electrode.
2. An electrical resonator as claimed in claim 1, further comprising a connection to one of the plurality of sides of the first electrode, wherein one of the frame elements is disposed along the one side of the first electrode.
3. An electrical resonator as claimed in claim 1, further comprising a connection to one of the plurality of sides of the second electrode, wherein another frame element is disposed only along the one side of the second electrode.
4. An electrical resonator as claimed in claim 1, wherein another frame element is disposed over the first electrode.
5. An electrical resonator as claimed in claim 1, wherein the first electrode comprises a first material, and the frame element comprises the first material.
6. An electrical resonator as claimed in claim 1, wherein the first electrode comprises a first material, and the frame element comprises a second material.
7. An electrical resonator as claimed in claim 1, wherein the frame element has a first acoustic impedance and the active area has a second acoustic impedance that differs from the first acoustic impedance.
8. An electrical resonator as claimed in claim 7, wherein an acoustic impedance mismatch results in reflections of spurious modes at the frame element.
9. An electrical resonator as claimed in claim 1, further comprising at least one frame element disposed along a side of the second electrode.
10. An electrical resonator as claimed in claim 1, further comprising at least one frame element disposed along a corresponding at least one side but not all sides of the second electrode and no two corresponding sides of the first and second electrodes both include a frame element.
11. An electrical resonator as claimed in claim 10, wherein the at least one frame element disposed along a corresponding at least one side but not all sides of the second electrode is disposed beneath the second electrode.
12. An electrical resonator as claimed in claim 1, wherein the electrical resonator comprises a film bulk acoustic resonator (FBAR).
13. An electrical filter, comprising:
one or more electrical resonators, each of which comprises:
a first electrode having a plurality of sides;
a second electrode having the plurality of sides;
a piezoelectric element disposed between the first and second electrodes; and
at least one raised frame element disposed between the first electrode and the second electrode and along a corresponding at least one side but not all sides of the first electrode.
14. An electrical filter as claimed in claim 13, further comprising a connection to one of the plurality of sides of the first electrode, wherein one of the frame elements is disposed along the one side of the first electrode.
15. An electrical filter as claimed in claim 13, wherein another frame element is disposed over the first electrode.
16. An electrical filter as claimed in claim 13, wherein the first electrode comprises a first material, and the frame element comprises the first material.
17. An electrical filter as claimed in claim 13, wherein the first electrode comprises a first material, and the frame element comprises a second material.
18. An electrical filter as claimed in claim 13, wherein the first electrode is a lower electrode and the second electrode is an upper electrode.
19. An electrical filter as claimed in claim 13, wherein the frame element has a first acoustic impedance and the active area has a second acoustic impedance that differs from the first acoustic impedance.
20. An electrical filter as claimed in claim 13, wherein the electrical resonator further comprises at least one frame ele- ment disposed along a corresponding at least one side but not all sides of the second electrode and no two corresponding sides of the first and second electrodes both include a frame element.

21. An electrical filter as claimed in claim 20, wherein the at least one frame element disposed along a corresponding at least one side but not all sides of the second electrode is disposed beneath the second electrode.

22. An electrical filter as claimed in claim 13, wherein each of the one or more electrical resonator comprises a film bulk acoustic resonator (FBAR).

* * * * *